United States Patent
Enzmann et al.

(10) Patent No.: US 11,916,166 B2
(45) Date of Patent: Feb. 27, 2024

(54) OPTOELECTRONIC DEVICE COMPRISING A CURRENT SPREADING LAYER

(71) Applicant: Osram OLED GmbH, Regensburg (DE)

(72) Inventors: Roland Heinrich Enzmann, Penang (MY); Christian Mueller, Deuerling (DE); Stefan Barthel, Regensburg (DE); Vanessa Eichinger, Wenzenbach (DE); Marc Christian Nenstiel, Regensburg (DE); Lorenzo Zini, Regensburg (DE)

(73) Assignee: Osram OLED GmbH, Regensburg (DE)

( * ) Notice: Subject to any disclaimer, the term of this patent is extended or adjusted under 35 U.S.C. 154(b) by 590 days.

(21) Appl. No.: 17/053,805

(22) PCT Filed: May 8, 2019

(86) PCT No.: PCT/EP2019/061800
§ 371 (c)(1),
(2) Date: Nov. 9, 2020

(87) PCT Pub. No.: WO2019/215217
PCT Pub. Date: Nov. 14, 2019

(65) Prior Publication Data
US 2021/0265525 A1    Aug. 26, 2021

(30) Foreign Application Priority Data
May 9, 2018   (DE) .................... 10 2018 111 198.3

(51) Int. Cl.
*H01L 33/14* (2010.01)
*H01L 25/16* (2023.01)
(Continued)

(52) U.S. Cl.
CPC ............ *H01L 33/14* (2013.01); *H01L 25/167* (2013.01); *H01L 33/005* (2013.01);
(Continued)

(58) Field of Classification Search
CPC ..... H01L 33/14; H01L 25/167; H01L 33/005; H01L 33/382; H01L 33/62; H01L 33/642;
(Continued)

(56) References Cited

U.S. PATENT DOCUMENTS

2010/0171135 A1   7/2010  Engl et al.
2013/0187192 A1   7/2013  Hoeppel
(Continued)

FOREIGN PATENT DOCUMENTS

DE    102010025320 A1   12/2011
DE    102012112988 A1    7/2014
WO      2008131735 A1   11/2008

*Primary Examiner* — Su C Kim
(74) *Attorney, Agent, or Firm* — VIERING, JENTSCHURA & PARTNER MBB (57) ABSTRACT

An optoelectronic device may include an optoelectronic semiconductor chip that is configured to emit electromagnetic radiation. The chip may include a first semiconductor layer, a second semiconductor layer, first and second current spreading structures, and a plurality of electrical contact elements. The first current spreading layer may be arranged on a side of the second semiconductor layer facing away from the first semiconductor layer. The plurality of electrical contact elements may electrically connect the first semiconductor layer to the first current spreading layer. The second current spreading layer may be electrically connected to the second semiconductor layer. The second current spreading layer may be arranged between the first current spreading layer and the second semiconductor layer where an insulat-
(Continued)

ing layer insulates a first electrical contact element and a second electrical contact element from the second current spreading layer.

16 Claims, 7 Drawing Sheets

(51) Int. Cl.
*H01L 33/00* (2010.01)
*H01L 33/38* (2010.01)
*H01L 33/62* (2010.01)
*H01L 33/64* (2010.01)

(52) U.S. Cl.
CPC ............ *H01L 33/382* (2013.01); *H01L 33/62* (2013.01); *H01L 33/642* (2013.01); *H01L 2933/0016* (2013.01); *H01L 2933/0066* (2013.01)

(58) Field of Classification Search
CPC ..... H01L 2933/0016; H01L 2933/0066; H01L 33/44; H01L 33/387
See application file for complete search history.

(56) References Cited

U.S. PATENT DOCUMENTS

| | | |
|---|---|---|
| 2015/0345727 A1 | 12/2015 | Herrmann et al. |
| 2016/0027980 A1 | 1/2016 | Hahn et al. |
| 2016/0359087 A1* | 12/2016 | Lee ........................... F21S 8/02 |
| 2017/0200861 A1 | 7/2017 | Pfeuffer et al. |
| 2018/0301597 A1* | 10/2018 | Park ........................ H01L 33/14 |

* cited by examiner

OPTOELECTRONIC DEVICE COMPRISING A CURRENT SPREADING LAYER

CROSS-REFERENCE TO RELATED APPLICATIONS

The present application is a national stage entry according to 35 U.S.C. § 371 of PCT application No.: PCT/EP2019/061800 filed on May 8, 2019; which claims priority to German Patent Application Serial No.: 10 2018 111 198.3 filed on May 9, 2018; all of which are incorporated herein by reference in their entirety and for all purposes.

TECHNICAL FIELD

An optoelectronic semiconductor device having a first current spreading structure and a second current spreading structure is disclosed.

BACKGROUND

A light emitting diode (LED) is a light emitting device based on semiconductor materials. An LED usually includes a pn junction. When electrons and holes recombine with one another in the area of the pn junction, for example, because a corresponding voltage is applied, electromagnetic radiation is generated. LEDs have been developed for a variety of applications including display devices, lighting devices, automotive lighting, projectors and others. For example, arrangements of LEDs or light-emitting areas, each with a plurality of LEDs or light-emitting areas, are widely used for these purposes.

SUMMARY

According to embodiments, an optoelectronic device comprises an optoelectronic semiconductor chip which is suitable for emitting electromagnetic radiation and comprises a first semiconductor layer of a first conductivity type, a second semiconductor layer of a second conductivity type, a first and a second current spreading layer, and a plurality of electrical contact elements. The first semiconductor layer is arranged over the second semiconductor layer. Electromagnetic radiation emitted by the optoelectronic semiconductor chip is output via a first main surface of the first semiconductor layer. The first current spreading layer is arranged on a side of the second semiconductor layer facing away from the first semiconductor layer. The plurality of electrical contact elements is suitable for electrically connecting the first semiconductor layer to the first current spreading layer. The second current spreading layer is electrically connected to the second semiconductor layer. The electrical contact elements comprise a first electrical contact element and a second electrical contact element, with the first differing from the second electrical contact element.

According to embodiments, the semiconductor chip includes a plurality of active zones, which are each arranged in an area between the first and second semiconductor layers and between the electrical contact elements, respectively. The first electrical contact element is connected to an associated active zone via a first resistance value, and the second electrical contact element is connected to an associated active zone via a second resistance value. In this process, the first resistance value differs from the second resistance value. According to an alternative interpretation, an active zone may be arranged between the first and second semiconductor layers and interrupted by the electrical contact elements. In this case, the term "resistance value" relates to the resistance between the electrical contact and the associated section of the active zone. The active zone may, for example, be a pn junction between the first and second semiconductor layers. According to further embodiments, the active zone may also include a heterostructure or one or more quantum wells.

For example, the electrical contact elements may extend through the second semiconductor layer and be insulated from the material of the second semiconductor layer via an insulating layer. According to embodiments, the diameter of the first contact element may differ from the diameter of the second contact element.

According to embodiments, the second current spreading layer may be arranged between the first current spreading layer and the second semiconductor layer. In this process, the electrical contact elements may be insulated from the second current spreading layer by an insulating layer.

The optoelectronic device may further include a contact layer which is suitable for electrically connecting the second current spreading layer to the second semiconductor layer. In this process, a lateral distance of the contact layer from the first contact element may differ from the lateral distance of the contact layer from the second contact element.

According to further embodiments, a laterally measured layer thickness of the insulating layer adjacent to the first contact element may differ from the laterally measured layer thickness of the insulating layer adjacent to the second contact element.

For example, the first current spreading layer may be connected to a first contact portion which is arranged on a first main surface of the semiconductor chip. In this process, the first contact element is arranged closer to the first contact portion than the second contact element, and the first resistance value is greater than the second.

According to embodiments, the sum S1 of lead resistances through the first and second current spreading layers and series resistances through the first and second semiconductor layers for the first electrical contact element and the sum S2 of lead resistances through the first and second current spreading layers and series resistances through the first and second semiconductor layers for the second electrical contact element may satisfy the following relationship: |S1−S2|/S1<0.1.

For example, the first current spreading layer may be connected to a first contact portion, and the second current spreading layer may be connected to a second contact portion. The first and the second contact portions are each arranged on a first main surface of the optoelectronic device.

According to further embodiments, the optoelectronic semiconductor chip may be placed on a heat-dissipating carrier having areas of different thermal conductivity. For example, the second contact element is arranged in an area having a better thermal conductivity than the area in which the first contact element is arranged.

For example, the heat-dissipating carrier may connect the first current spreading layer to a first contact portion and connect the second current spreading layer to a second contact portion.

A method for manufacturing an optoelectronic device comprises the formation of an optoelectronic semiconductor chip which is suitable for emitting electromagnetic radiation. The optoelectronic semiconductor chip includes a first semiconductor layer of a first conductivity type, a second semiconductor layer of a second conductivity type, a first and a second current spreading layer, and a plurality of electrical contact elements. The first semiconductor layer is arranged over the second semiconductor layer. Electromagnetic radiation emitted by the optoelectronic semiconductor chip is output via a first main surface of the first semiconductor layer. The first current spreading layer is arranged on a side of the second semiconductor layer facing away from the first semiconductor layer. The plurality of electrical contact elements is suitable for electrically connecting the first semiconductor layer to the current spreading layer. The plurality of electrical contact elements comprises a first electrical contact element and a second electrical contact element. The second current spreading layer is electrically connected to the second semiconductor layer. The method further includes the setting of a resistance value of a first electrical contact element and of a second electrical contact element, so that the sum S1 of lead resistances through the first and second contact layers and series resistances through the first and second semiconductor layers for the first electrical contact element and the sum S2 of lead resistances through the first and second contact layers and series resistances through the first and second semiconductor layers for the second electrical contact element satisfy the following relationship: $|S1-S2|/S1<0.1$.

For example, the formation of an optoelectronic semiconductor chip may include the formation of the first semiconductor layer of the first conductivity type on a growth substrate, the formation of the second semiconductor layer of the second conductivity type over the first semiconductor layer, the formation of the second current spreading layer over the second semiconductor layer, the formation of a plurality of electrical contact elements, and the formation of the first current spreading layer over the second current spreading layer, whereby a layer stack results. The method for manufacturing the optoelectronic device may further include the subsequent placing of the layer stack on a carrier and the subsequent removal of the growth substrate.

According to embodiments, an electric device comprises the optoelectronic device described. The electric device may be selected from the group of vehicle headlights, projectors and lighting devices.

BRIEF DESCRIPTION OF THE DRAWINGS

The accompanying drawings serve to provide an understanding of non-limiting embodiments. The drawings illustrate non-limiting embodiments and, together with the description, serve to explain them. Further non-limiting embodiments and numerous of the intended advantages emerge directly from the following detailed description. The elements and structures shown in the drawings are not necessarily shown true to scale. Identical reference numerals refer to the same or corresponding elements and structures.

DETAILED DESCRIPTION

In the following detailed description, reference is made to the accompanying drawings, which form part of the disclosure, and in which specific exemplary embodiments are shown for purposes of illustration. In this context, directional terminology such as "top", "bottom", "front side", "back side", "over", "on", "in front of", "behind", "front", "back", etc. is used related to the orientation of the figures just described. Since the components of the exemplary embodiments may be positioned in different orientations, the directional terminology is only used for explanation and is not restrictive in any way.

The description of the exemplary embodiments is not restrictive, since also other exemplary embodiments exist and structural or logical changes may be made without deviating from the scope defined by the claims. In particular, elements of exemplary embodiments described in the following text may be combined with elements of other exemplary embodiments described, unless the context indicates otherwise.

The terms "wafer" and "semiconductor substrate" used in the following description may include any semiconductor-based structure that has a semiconductor surface. The wafer and structure are to be understood to include doped and undoped semiconductors, epitaxial semiconductor layers, possibly supported by a base, and further semiconductor structures. For example, a layer made of a first semiconductor material may be grown on a growth substrate made of a second semiconductor material or of an insulating material, for example, on a sapphire substrate. Depending on the intended use, the semiconductor may be based on a direct or an indirect semiconductor material. Examples of semiconductor materials particularly suited for generating electromagnetic radiation include, in particular, nitride semiconductor compounds through which, for example, ultraviolet, blue or longer-wave light may be generated, such as GaN, InGaN, AlN, AlGaN, AlGaInN, phosphide semiconductor compounds, through which, for example, green or longer-wave light may be generated, such as GaAsP, AlGaInP, GaP, AlGaP, as well as other semiconductor materials such as AlGaAs, SiC, ZnSe, GaAs, ZnO, $Ga_2O_3$, diamond, hexagonal BN, and combinations of the materials mentioned. The stoichiometric ratio of the ternary compounds may vary. Further examples of semiconductor materials may include silicon, silicon germanium, and germanium. In the context of the present description, the term "semiconductor" also includes organic semiconductor materials. The terms "lateral" and "horizontal", as used in this description, are intended to describe an orientation or alignment which runs essentially parallel to a first surface of a substrate or semiconductor body. This may, for example, be the surface of a wafer or a die or a chip. The term "vertical", as used in this description, is intended to describe an orientation which is essentially perpendicular to the first surface of the substrate or semiconductor body.

To the extent that the terms "have", "contain", "comprise", "include" and the like are used herein, they are open-ended terms that indicate the presence of said elements or features, but do not rule out the presence of other elements or features. The indefinite articles and the definite articles comprise both the plural and the singular, unless the context clearly indicates otherwise.

In the context of this description, the term "electrically connected" means a low-resistance electrical connection between the connected elements. The electrically connected elements need not necessarily be directly connected to one another. Additional elements may be arranged between electrically connected elements.

The term "electrically connected" also includes tunnel contacts between the connected elements.

Figure 1A:
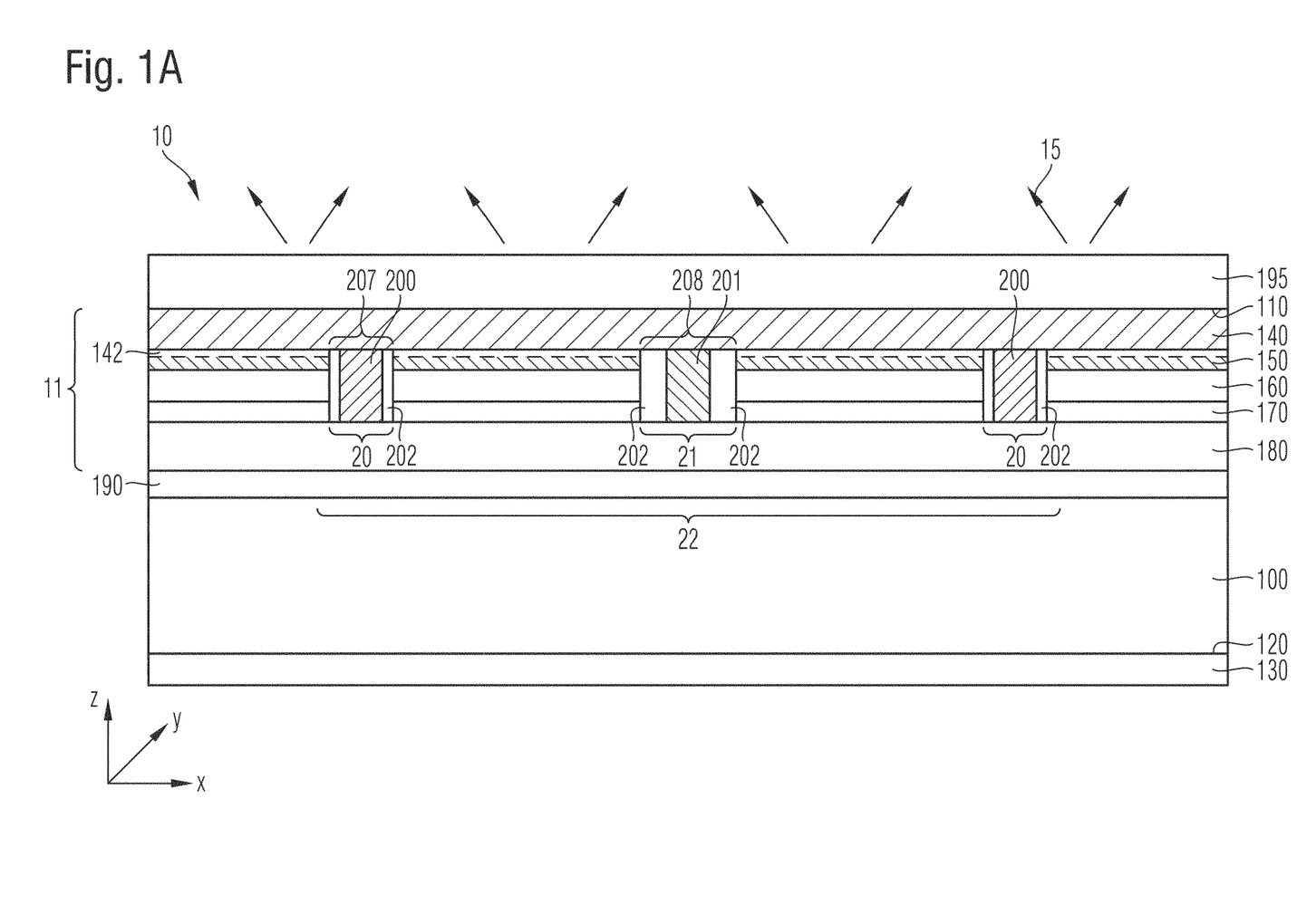
FIG. 1A shows a schematic cross-sectional view of a portion of an optoelectronic device according to embodiments.

FIG. 1A shows a schematic cross-sectional view through a portion of an optoelectronic device according to embodiments. The optoelectronic device 10 comprises an optoelectronic semiconductor chip 11 which is suitable for emitting electromagnetic radiation 15. The optoelectronic semiconductor chip includes a first semiconductor layer 140 of a first conductivity type, for example, n-type, and a second semiconductor layer 150 of a second conductivity type, for example, p-type. The optoelectronic semiconductor chip also contains a first current spreading layer 180 and a plurality of electrical contact elements 20, 21, 22. The first semiconductor layer 140 is arranged over the second semiconductor layer 150. That is, the second semiconductor layer 150 is arranged between the first semiconductor layer 140 and the first current spreading layer 180. Electromagnetic radiation 15 emitted by the optoelectronic semiconductor chip is output via a first main surface 110 of the first semiconductor layer 140. The first current spreading layer 180 is arranged on a side of the second semiconductor layer 150 facing away from the first semiconductor layer 140.

The plurality of electrical contact elements or knots 20, 21, 22 is suitable for electrically connecting the first semiconductor layer 140 to the first current spreading layer 180. The electrical contact elements 22 comprise a first electrical contact element 21 and a second electrical contact element 21, wherein the first differs from the second electrical contact element. The optoelectronic semiconductor chip 11 may contain further layers. For example, the optoelectronic semiconductor chip 11 may further include a second current spreading layer 160. The second current spreading layer 160 may be arranged between the first current spreading layer and the second semiconductor layer 150. The electrical contact elements 20, 21, 22 extend, for example, through the second semiconductor layer 150 and through the second current spreading layer and may be electrically isolated from the second semiconductor layer 150 and from the second current spreading layer 160 via an insulating layer 202. The interior of the electrical contact elements 20, 21, 22 is filled with a conductive material 200, 201. For example, the conductive material may include a portion of the first current spreading layer 180.

According to embodiments, the semiconductor chip may include a plurality of active zones 142, which are each arranged in an area between the first and second semiconductor layers 140, 150. The active zone, for example, has a pn junction, a double heterostructure, a single quantum well (SQW) or a multi quantum well (MQW) structure for the generation of radiation. In this process, the term "quantum well structure" has no meaning with regard to the dimensionality of the quantization. Thus, it includes, among other things, quantum wells, quantum wires and quantum dots, as well as any combination of these structures. The semiconductor chip described is fastened on a carrier substrate 100 via an adhesive layer or bonding layer 190. For example, the carrier substrate 100 may contain aluminum nitride. The carrier substrate 100 may be insulating and may, for example, be a glass substrate. A back side metallization 130 is placed on the second main surface or back side 120 of the carrier substrate 100.

The electrical contact elements 20, 21, 22 may, for example, be designed in the form of a circular cylinder, an elliptical cylinder, a cuboid, a cone or truncated cone, a pyramid or a truncated pyramid. According to further embodiments, the contact element 20, 21, 22 may also be designed in the form of a trench, the longitudinal axis of which extends in a y-direction. The first electrical contact element 20 is formed within a first contact opening 207. The second electrical contact element 21 is formed within a second contact opening 208.

According to embodiments, the first current spreading layer 180 and the second current spreading layer 160 may be connected via contact portions (not shown in FIG. 1A) which may, for example, be located in the area of the first main surface of the optoelectronic device 10. The contact portions are usually located at the edge of the optoelectronic device. According to further embodiments, however, the contact portions may also be arranged in the area of the back side 120 of the carrier substrate 100. For example, the light-emitting front side of the semiconductor chip is free of electrical contact points such as bond pads. Only the contact elements 20, 21, 22 are arranged in the area of the first surface. In this way, the risk of shading and/or absorption of a portion of the electromagnetic radiation 15 emitted by the active zones during operation is reduced by such contact areas.

For example, the semiconductor chip 11 is a thin-film light-emitting diode chip. A carrier substrate 100 is arranged on the side of the second semiconductor layer 150 facing away from the first semiconductor layer 140. For example, the carrier substrate 100 differs from the growth substrate on which the semiconductor layer sequence has been grown, which, for example, includes the first semiconductor layer 140, the active zone 142 and the second semiconductor layer 150. In particular, a material of the first and second semiconductor layers 140, 150 may be GaN-based, i.e. consisting of GaN or containing GaN. Specific examples include InGaN, AlGaN or InAlGaN. A layer thickness of the first semiconductor layer 140 is greater than 100 nm, for example, more than 500 nm, for example, approximately 1 μm. The second semiconductor layer 150 has a layer thickness of less than 500 nm, for example, less than 200 nm, for example, more than 50 nm. The second semiconductor layer 150 has, for example, a lower electrical conductivity than the first semiconductor layer 140. The second semiconductor layer 150 may, for example, be connected to the second current spreading layer 160 in a planar manner. According to further embodiments, the second semiconductor layer 150 is connected to the second current spreading layer 160 via an additional contact layer (not shown in FIG. 1A). The first semiconductor layer 140 is connected to the first current spreading layer 180 via a plurality of electrical contact elements 20, 21, 22.

A passivation layer 195, for example, made of silicon oxide, silicon nitride or a combination of these materials, is arranged over the first main surface 110 of the first semiconductor layer 140.

As indicated in FIG. 1A, the first electrical contact element 20 differs from the second electrical contact element 21.

Figure 1B:
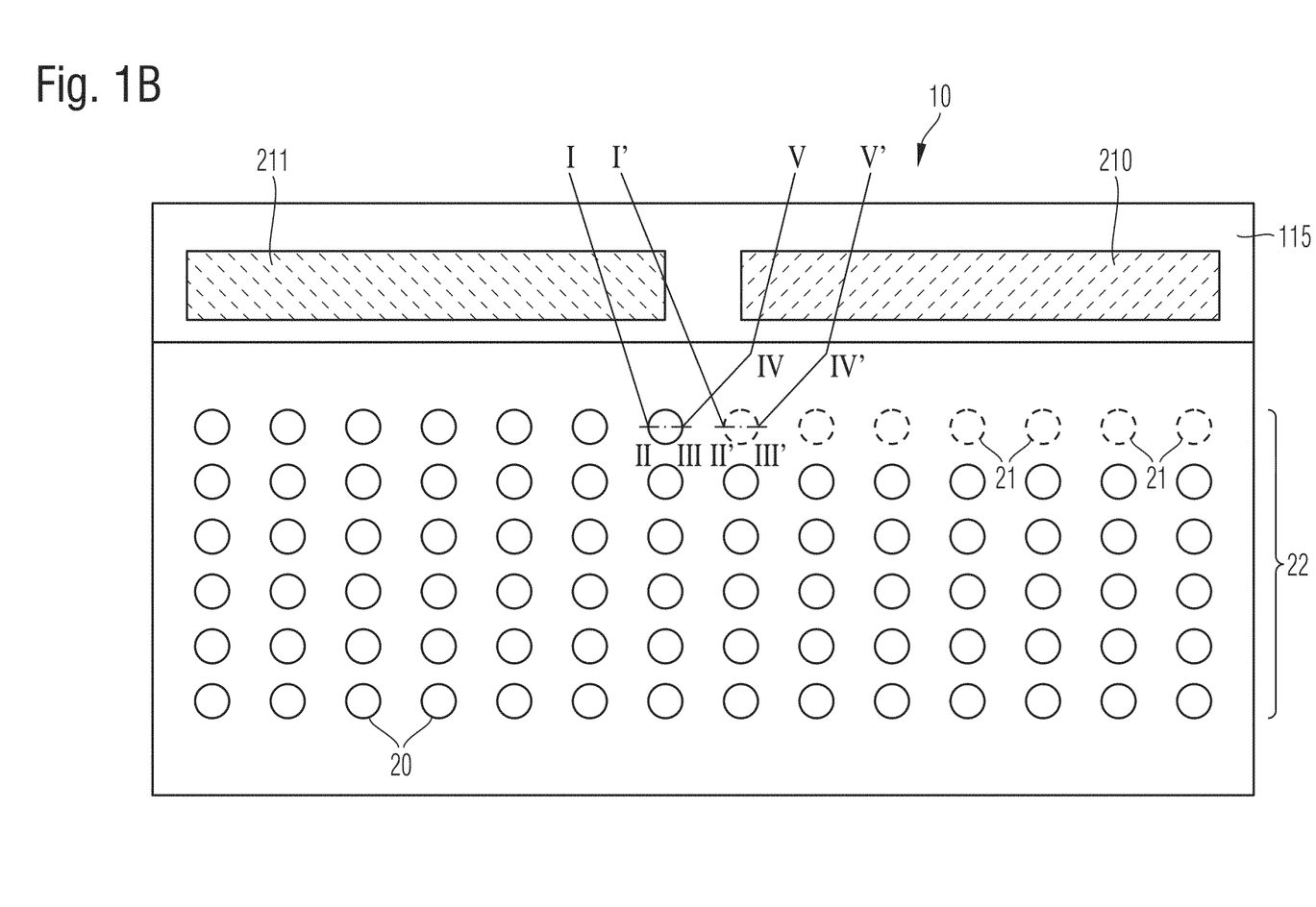
FIG. 1B shows a schematic horizontal cross-sectional view of an optoelectronic device according to embodiments.

FIG. 1B shows a plan view of a portion of an optoelectronic device 10 according to embodiments. As can be seen, the optoelectronic device 10 includes a plurality of electrical contact elements 20. The electrical contact elements comprise first electrical contact elements 20 and second electrical contact elements 21. The first electrical contact element 20 differs from the second electrical contact element 21. The optoelectronic device 10 may, for example, include a first contact portion 210 and a second contact portion 211. For example, both the first contact portion 210 and the second contact portion 211 may be arranged in the area of a first main surface 115 of the optoelectronic device 10. The first contact portion 210 is, for example, electrically connected to the first semiconductor layer 140 via the first current spreading layer 180 and the electrical contact elements 20, 21, 22. The second contact portion 211 is electrically connected to the second semiconductor layer 150 via the second current spreading layer 160. The described optoelectronic device is usually operated at currents greater than 1 A/mm². For example, the current densities may be approximately 5 A/mm². For example, the diameter of the first or second contact element 20, 21 may be more than 0.5 µm, respectively. For example, the diameter of the first or second contact element 20, 21 may be less than 100 µm, respectively. The distance between the individual contact elements may be greater than respectively. The distance between the individual contact elements may be less than 300 µm, respectively.

The feature "the first contact element differs from the second electrical contact element" means within the scope of the present disclosure, for example, that the connection resistance of the first electrical contact element 20 to an associated active zone may differ from the electrical connection resistance of the second electrical contact element 21 to an associated active zone. This may, for example, be realized in that the electrically conductive material 200 of the first contact element 20 has a different conductivity than the electrically conductive material 201 (shown in FIG. 1A) of the second electrical contact element. According to further embodiments, the shape or dimensions of the electrical contact elements may be different, respectively. For example, the first electrical contact element 20 may have a larger cross-sectional area than the second electrical contact element 21. As a result of the larger cross-sectional area, the electrical resistance of the first electrical contact element may, for example, be less than the electrical resistance of the second electrical contact element 21. According to further embodiments, a length of the electrical path between the electrical contact element and the active zone connected to the electrical contact element may vary. As indicated in FIG. 1A, this may, for example, be implemented by accordingly setting the laterally measured layer thickness of the insulating layer 202, which insulates the conductive filling of the electrical contact element from the adjacent second semiconductor layer 150. In this way, for example, the distance between the active zone 142 and the associated electrical contact element or electrically conductive filling 201 of the second electrical contact element 21 may be increased, whereby the resistance to the first electrical contact element 20 is increased. This list is not exhaustive; further options will be discussed in the following text.

Due to the fact that the first electrical contact element differs from the second electrical contact element, energization of different areas of the optoelectronic semiconductor chip 11 may be achieved as required. For example, the particular contact elements 20, 21, 22 may be provided in such a manner that those contact elements with a smaller distance from the associated contact portion, which are usually exposed to a current density that is too high at the intended operating currents, have a higher connection resistance than other contact elements that are arranged at a greater distance from the associated contact portion.

Inhomogeneous current densities and impressions may thereby be avoided. As a result, a temperature gradient across the chip may be reduced. Furthermore, an inhomogeneous luminance, which could result from an inhomogeneous current density, may be avoided. As a result, for example, more homogeneous light may be produced. Furthermore, degradation of the contact elements, in particular, of such contact elements that are located in the vicinity of the first contact portion 210, may be prevented. The aging of the optoelectronic device may be reduced accordingly. Due to the increased homogeneity of the current impression, an overall greater efficiency is achieved.

Usually, very high current densities are achieved locally in the case of those contact elements which are arranged in the vicinity of the first contact portion 210. According to embodiments, the contact elements may be designed in such a manner that the series resistance of those electrical contact elements 22 that are arranged in the vicinity of the first contact portion 210 is increased, while the series resistance of those electrical contact elements 22 that are arranged at a certain distance from the first contact portion 210 is, depending on the distance from the first contact portion 210, reduced. For example, the calculation may be carried out in such a way that the sum of lead resistances (through the first current spreading layer and the second current spreading layer, respectively) and series resistances, which is defined by the connection resistance between the electrical contact element and the associated active zone, is always the same. For example, this connection resistance may, in particular, be determined by the distance to be overcome in the first semiconductor layer 140. Uniform energization of all electrical contact elements may thereby be achieved.

Figure 2A:
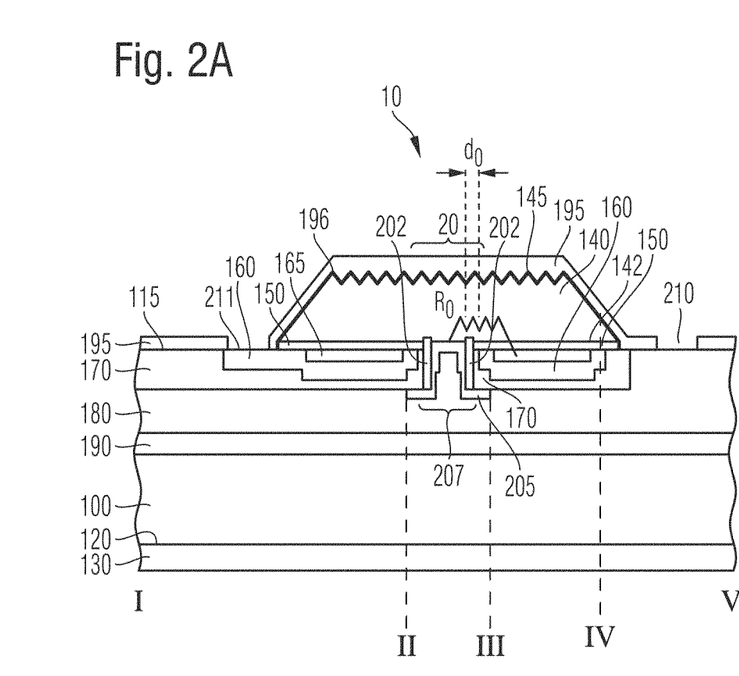
FIGS. 2A and 2B show schematic cross-sectional views through portions of an optoelectronic device.
Figure 2B:
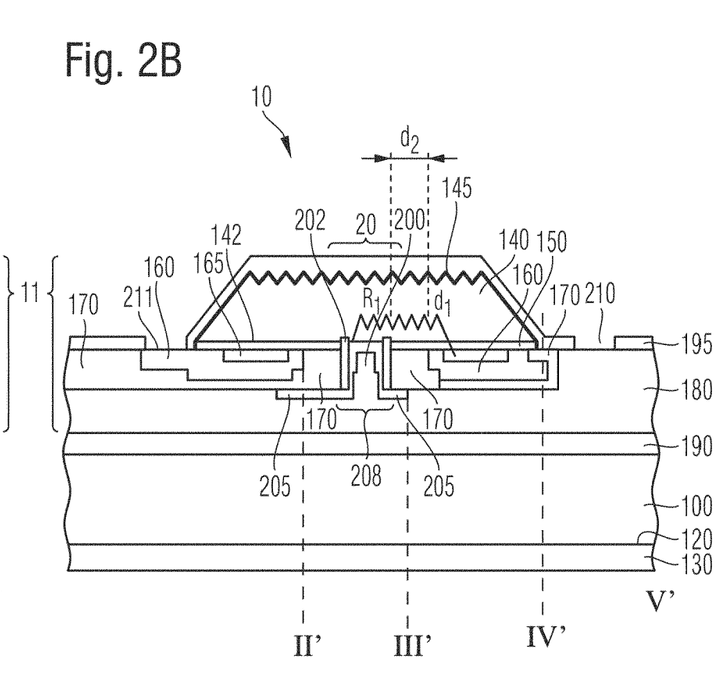

Generally speaking, the sum S1 of lead resistances through the first and second contact layers and series resistances through the first and second semiconductor layers for the first electrical contact element and the sum S2 of lead resistances through the first and second contact layers and series resistances through the first and second semiconductor layers for the second electrical contact element may satisfy the following relationship: $|S1-S2|/S1<0.3$. According to further embodiments, the following may apply: $|S1-S2|/S1<0.1$ or $|S1-S2|/S1<0.05$. FIGS. 2A and 2B show cross-sectional views through a first and a second electrical contact element 20, 21, respectively. In this process, the cross sections both run along the directions, as indicated in FIG. 1B. More precisely, the representation in FIG. 2A is a cross-sectional view showing a cross section through a first contact element (knot) 20 between II and III. The area between I and II shows the portion from the second contact portion 211 to the edge of the contact element 20. The cross-sectional view between III and IV shows the area between the first contact element 20 and the edge of the arrangement of the contact elements. The cross-sectional view between IV and V shows a cross section through a first contact portion 210.

FIG. 2B is drawn in a similar manner. In this process, the cross-sectional view shows, between II' and III', the cross section through a second electrical contact element (knot) 21.

The semiconductor device 10 shown in FIG. 2A includes a first semiconductor layer 140 of a first conductivity type, and a second semiconductor layer 150 of a second conductivity type. A first current spreading layer 180 is arranged on a side of the second semiconductor layer 150 facing away from the first semiconductor layer 140. Furthermore, a second current spreading layer 160 is arranged between the second semiconductor layer 150 and the first current spreading layer 180. The first and second current spreading layers 180, 160 may be metallic, for example, contain an alloy of Ti/Pt, Au or any one of these metals. Furthermore, the current spreading layer 160, 180 may also contain nickel. The composition of the current spreading layers may differ from one another.

For example, the second current spreading layer 160 may be connected to the second semiconductor layer 150 via a contact layer 165 which, for example, is reflective. For example, the contact layer 165 may be designed as a silver mirror. On one hand, this contact layer 165 ensures a good electrical contact between the second current spreading layer 160 and the second semiconductor layer 150. Furthermore, the contact layer 165 reflects electromagnetic radiation which was emitted by the active zone 142 in the direction of the carrier substrate 100, back again in the direction of the first main surface 110 of the first semiconductor layer. The first current spreading layer 180 is isolated from the second current spreading layer 160 by an insulating layer 170. For example, the insulating layer may contain silicon oxide, silicon nitride or a combination of these materials. The electrical contact element 20, which connects the first current spreading layer 180 to the first semiconductor layer 140, is arranged in a first contact opening 207, which penetrates the second semiconductor layer 150 and the second current spreading layer 160. A portion of the insulating layer 170 is arranged between the side wall of the first contact opening 207 and the second current spreading layer 160 in order to isolate the electrically conductive filling of the contact element 20 from the second current spreading layer 160. An insulating layer 202 is placed on a side wall of the first contact opening. For example, the insulating layer 202 may contain SiOx, SiN or other dielectric layers or consist of these materials. The insulating layer 202 may, for example, electrically isolate the electrically conductive material 200 from the second semiconductor layer 150 or protect the active zone. For example, the side walls of the first contact opening 207 are lined with a reflecting conductive layer 205, for example, a silver mirror. More precisely, the side walls and horizontal areas of the contact opening 207 may be covered with the reflecting conductive layer 205. Furthermore, a horizontal area of the reflecting conductive layer 205 is formed at the interface with the first semiconductor layer 140. The reflecting conductive layer 205 is, for example, dimensioned in such a manner that it approximately or partially overlaps the contact layer 165 in the horizontal direction. Also in this way, electromagnetic radiation emitted in the direction of the carrier substrate 100 is reflected by the layer 205 and the contact layer 165 combined therewith.

For example, in such an implementation, the first contact element may be designed differently from the second contact element, so that the horizontal distance between the contact layer 165 and the contact element 20, 21, 22 is varied.

A protective layer 196 which, for example, contains $Al_2O_3$ or consists of $Al_2O_3$, may be arranged over the first semiconductor layer 140. This protective layer 196 may, for example, protect the semiconductor layers from moisture.

A portion 145 of the first main surface 110 of the first semiconductor layer 140 may be roughened in order to improve the outcoupling efficiency of generated electromagnetic radiation into the adjacent passivation layer 195.

FIG. 2B shows a cross-sectional view through a corresponding second contact element. For example, the second electrical contact elements 21, which are arranged in the vicinity of the first contact portion 210, have a distance between the contact opening 208 and the contact layer 165 that is a few µm greater than the first electrical contact elements 20, which have a larger distance to the first contact portion 210. As a result, a length of travel of the current from the second electrical contact elements 21 through the first semiconductor layer 140 is, in the vicinity of the contact portion 210, longer, whereby the series resistance is increased. Conversely, the series resistance is reduced for the first electrical contact elements 20 that have a larger distance to the first contact portion 210.

Furthermore, as can be seen, a horizontal width dl of the insulating layer 170 is, in the case of the second contact element, substantially greater than a horizontal width dO of the insulating layer 170 in the case of a first contact element. Furthermore, a lateral dimension of the contact layer 165 is, in the vicinity of the second contact element, less than the lateral dimension of the contact layer in the vicinity of the first contact element. As a result, the series resistance R1 between the conductive filling 200 of the second contact element 21 and an associated active zone between the first semiconductor layer 140 and the second semiconductor layer 150 has a greater resistance than the resistance value R0 between the conductive filling 200 of the first contact element 20 and the associated active zone between the first semiconductor layer 140 and the second semiconductor layer 150. The position of the electrical contact between the first semiconductor layer 140 and the second semiconductor layer 150 is determined by the horizontal extension of the contact layer 165. Due to the fact that, as illustrated in FIG. 2B, the position of the contact layer 165 is shifted horizontally, the resistance of the second electrical contact element is increased. Accordingly, a resistance value may be determined by appropriately performing the method for patterning the contact layer 165.

Figure 3A:
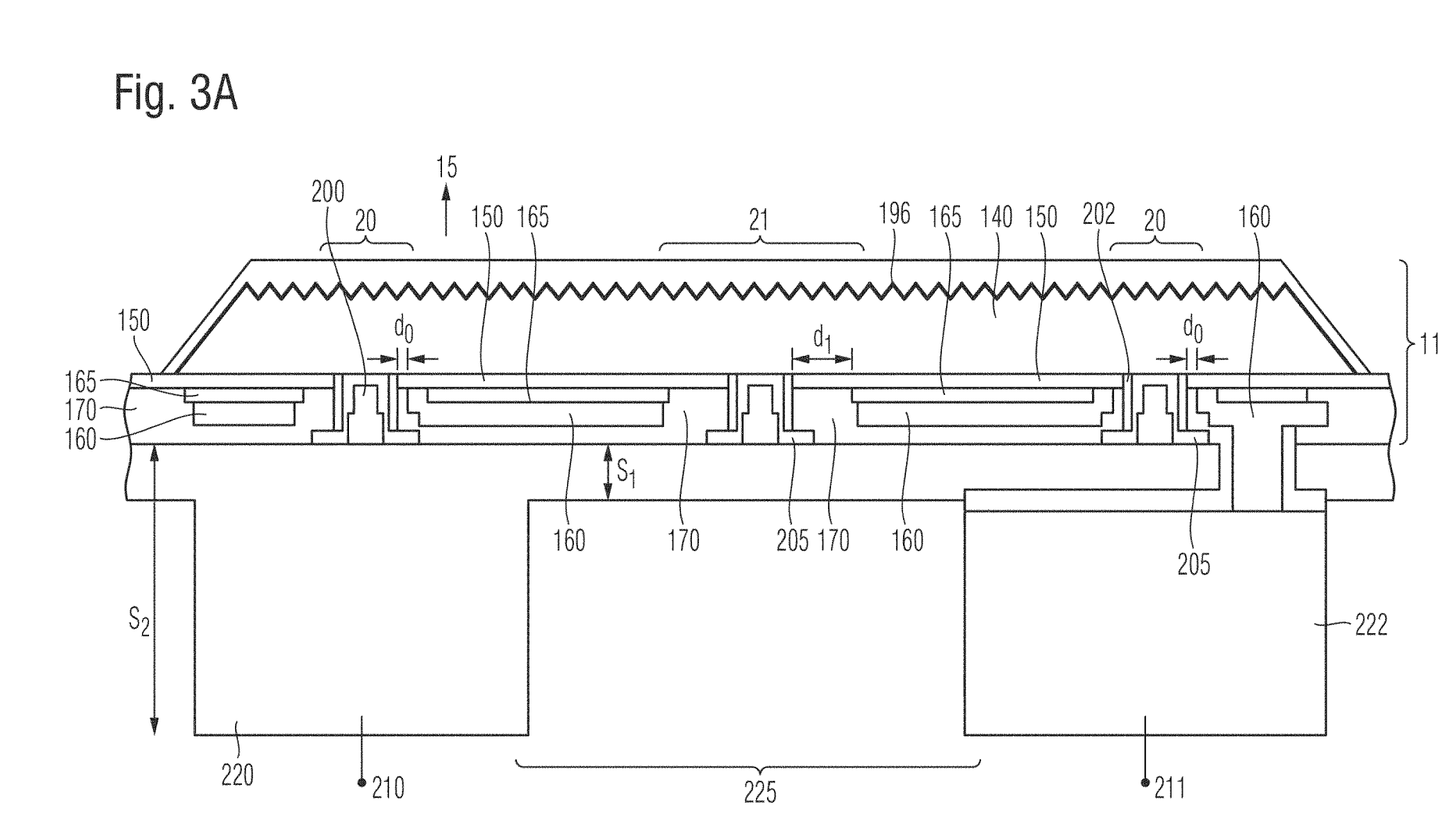
FIG. 3A shows a schematic cross-sectional view through portions of an optoelectronic device according to further embodiments.

According to embodiments of FIGS. 2A and 2B, the first contact portion 210, which is connected to the first current spreading layer 180, is arranged on a first main surface 115 of the optoelectronic device 10. Furthermore, the second contact portion 211 is arranged in the area of the first main surface 115 of the optoelectronic device. According to further embodiments, the first contact portion 210 and/or the second contact portion 211 may also be arranged in other positions. A passivation layer 195 is arranged over the optoelectronic device. According to further embodiments, the optoelectronic semiconductor chip may have a conductive carrier instead of an insulating carrier substrate. For example, as illustrated in FIG. 3A, the arrangement of first, second semiconductor layers and second current spreading layer 160 may be arranged over an electrically conductive carrier 225. For example, the carrier 225 serves as a heat-dissipating element. The electrically conductive carrier 225 comprises a first electrically conductive carrier member 220 and a second electrically conductive carrier member 222. For example, the electrically conductive carrier member is connected to the semiconductor layer sequence in such a manner that it acts as a first current spreading layer and is connected to the first semiconductor layer 140 via electrical contact elements 21, 20. The second electrically conductive carrier member 222 is insulated from the first electrically conductive carrier member 220 and connected to the second current spreading layer 160. In this way, the first contact portion 210 and the second contact portion 211 may be arranged on the back side of the optoelectronic device, i.e. on a side facing away from the semiconductor layer sequence.

As illustrated in FIG. 3A, the electrically conductive carrier 225 is patterned, i.e. the carrier 225 has a greater thickness in an edge area than in a central area of the optoelectronic device. Correspondingly, the heat dissipation in the central area having the layer thickness s1 is significantly less than in an edge area having the layer thickness s2.

As illustrated in FIG. 3A, it is envisaged that the second contact elements 21 are each arranged adjacent to the area with reduced heat dissipation or thickness s2 of the carrier. The first contact elements 20 are arranged in an area with greater heat dissipation or thickness s1 of the carrier. Due to the fact that the second contact elements are designed in a manner similar to that shown in FIG. 2B, a reduced current flows in the area of the second contact elements due to the increased resistance, so that lower heat generation takes place.

The first and second electrical contact elements 20, 21 are, for example, each designed as shown in FIG. 2B. The lateral width of the insulating layer 170 between the side wall of the contact opening and the contact layer 165 on the first contact elements differs from that on the second contact elements, respectively. Due to the fact that the resistance is increased in the area of the second contact elements 21, the problem of inhomogeneous heat dissipation may be effectively compensated for. More precisely, less heat builds up in the central area of the optoelectronic device, so that, as a result, a more homogeneous heat distribution is achieved within the semiconductor chip. In areas with good heat dissipation, more current is passed through the electrical contact elements than in areas with poor thermal connection. The series resistance is increased in the area with poor thermal connection, so that the current and thus the heat generation are reduced in this area. For example, in the area of the second contact element 21, the distance between the contact layer 165 and the contact element is typically increased by 10 µm compared to a first contact element. Again, a protective layer 196 may be arranged over the first semiconductor layer 140 as described above.

Figure 3B:
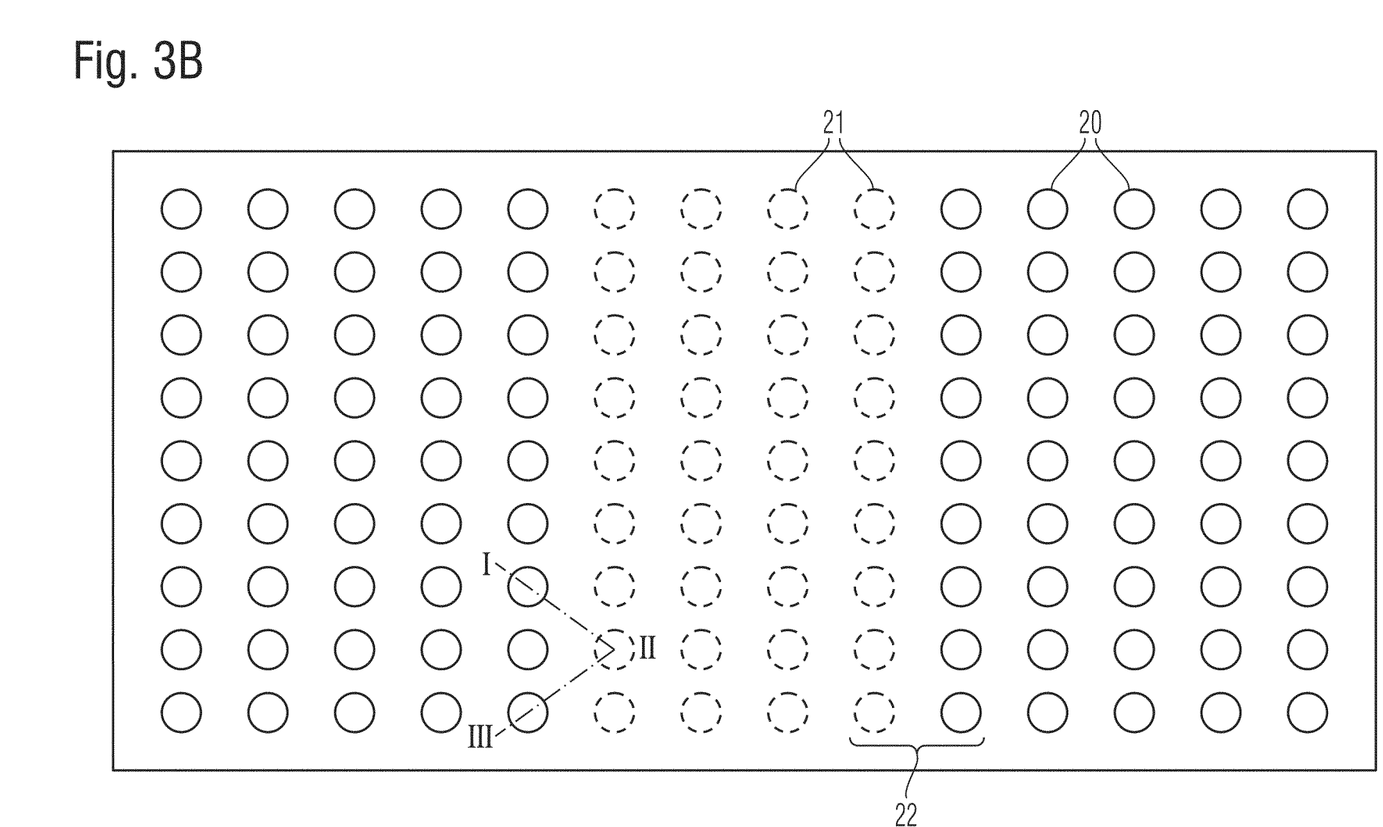
FIG. 3B shows a schematic horizontal cross-sectional view through a portion of an optoelectronic device.

FIG. 3B shows a schematic horizontal cross-sectional view through portions of the optoelectronic device shown in FIG. 3A. The optoelectronic device has a plurality of electrical contact elements 22. The electrical contact elements comprise first electrical contact elements 20 and second electrical contact elements 21. As illustrated in FIG. 3B, the first electrical contact elements 20 are arranged in an edge area of the carrier 225 having improved thermal connection, while the second electrical contact elements 21 are arranged in a central area of the carrier 225 having reduced thermal connection. As explained with reference to FIG. 3A, the second electrical contact elements differ from the first electrical contact elements. FIG. 3B also illustrates positions of the cross-sectional view shown in FIG. 3A.

According to embodiments, a method for manufacturing an optoelectronic device comprises the formation of an optoelectronic semiconductor chip which is suitable for emitting electromagnetic radiation and a first semiconductor layer of a first conductivity type, a second semiconductor layer of a second conductivity type, a first and a second current spreading layer, and a plurality of electrical contact elements. The first semiconductor layer is arranged over the second semiconductor layer. Electromagnetic radiation emitted by the optoelectronic semiconductor chip is output via a first main surface of the first semiconductor layer. The first current spreading layer is arranged on a side of the second semiconductor layer facing away from the first semiconductor layer. The plurality of electrical contact elements is suitable for electrically connecting the first semiconductor layer to the current spreading layer. The plurality of electrical contact elements comprises a first electrical contact element and a second electrical contact element. The second current spreading layer is electrically connected to the second semiconductor layer. The method further includes the setting of a resistance value of a first electrical contact element and of a second electrical contact element, so that the sum S1 of lead resistances through the first and second contact layers and series resistances through the first and second semiconductor layers for the first electrical contact element and the sum S2 of lead resistances through the first and second contact layers and series resistances through the first and second semiconductor layers for the second electrical contact element satisfy the following relationship: $|S1-S2|/S1<0.3$ or $|S1-S2|/S1<0.1$.

Figure 4:
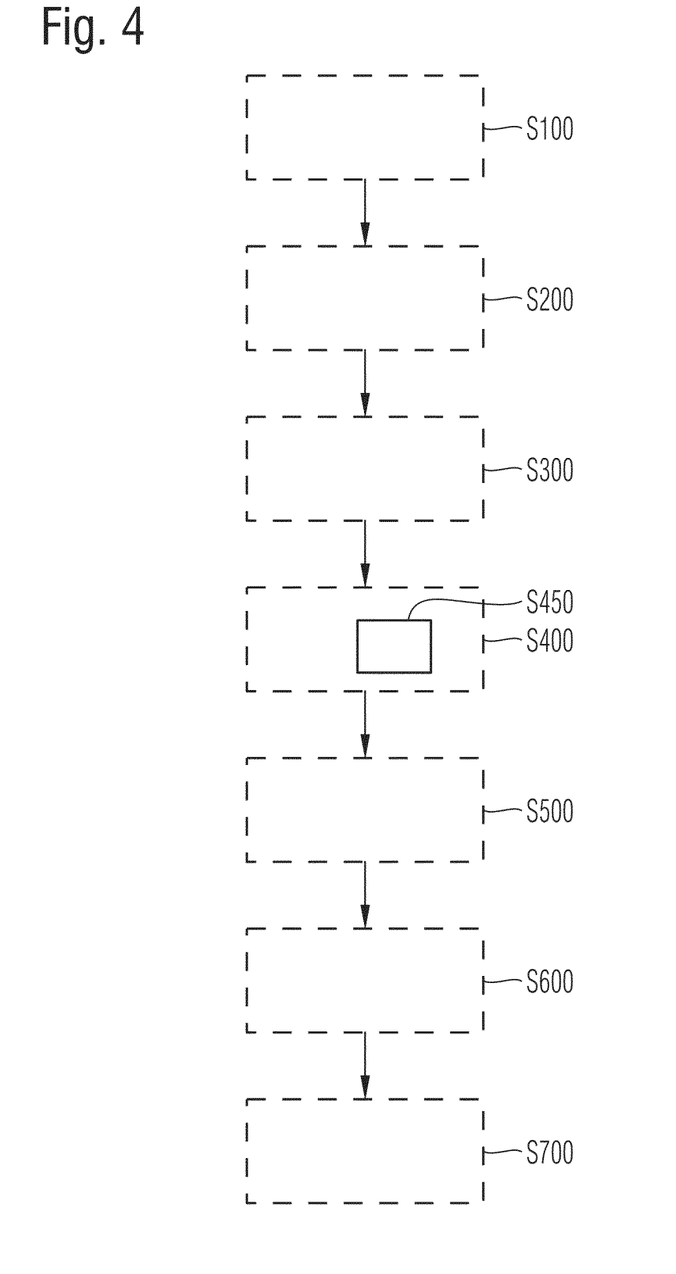
FIG. 4 summarizes a method according to embodiments.

For example, as illustrated in FIG. 4, the formation of an optoelectronic semiconductor chip includes the formation (S100) of the first semiconductor layer of the first conductivity type on a growth substrate, the formation (S200) of the second semiconductor layer of the second conductivity type over the first semiconductor layer, the formation (S300) of the second current spreading layer over the second semiconductor layer, the formation (S400) of a plurality of electrical contact elements, and the formation (S500) of the first current spreading layer over the second current spreading layer, whereby a layer stack results. The method for manufacturing the optoelectronic device includes the subsequent placing (S600) of the layer stack on a carrier and the subsequent removal (S700) of the growth substrate.

The setting of a resistance value (S450) of a first electrical contact element and a second electrical contact element in such a manner that the sum S1 of lead resistances through the first and second contact layers and series resistances through the first and second semiconductor layers for the first electrical contact element and the sum S2 of lead resistances through the first and second contact layers and series resistances through the first and second semiconductor layer for the second electrical contact element satisfy the described relationship, may be part of the method for forming a plurality of electrical contact elements.

As has been described, the resistance value of the individual contact elements may be adjusted by changing the properties of the contact elements. Correspondingly, it is possible to adjust the current flowing through the particular contact elements depending on the requirements of the optoelectronic device. For example, uniform or more homogeneous energization of the contact elements of the optoelectronic device may thus be achieved. According to further embodiments, the current flow may be adjusted to the heat dissipation of the optoelectronic device. For example, a higher current may be impressed in areas with better heat dissipation than in areas with poorer heat dissipation. As a result, the efficiency and the service life of the optoelectronic semiconductor device may be increased. Furthermore, a more homogeneous luminance may be achieved. For example, even at high current densities, the emission pattern of the optoelectronic device cannot change with the operating current.

Figure 5:
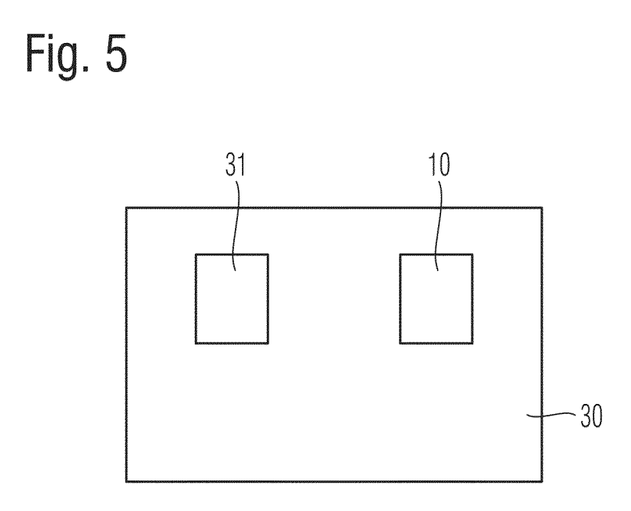
FIG. 5 shows an electric device according to embodiments.

Due to these effects, the optoelectronic device may, for example, be combined together with optical elements. Areas of application include, for example, car headlights but also projection and lighting applications. FIG. 5 shows an electric device 30 according to embodiments. The electric device 30 includes the optoelectronic device 10 described. For example, the electric device may additionally include an optical element 31. Examples of electric devices are vehicle headlights, projectors, and lighting devices.

Although specific embodiments have been illustrated and described herein, persons skilled in the art will recognize that the specific embodiments shown and described may be replaced by a multitude of alternative and/or equivalent embodiments without departing from the scope of the invention. The application is intended to cover any adaptations or variations of the specific embodiments discussed herein. Therefore, the invention is to be limited only by the claims and their equivalents.

LIST OF REFERENCES 10 optoelectronic device
11 optoelectronic semiconductor chip
15 emitted electromagnetic radiation
20 first electrical contact element
21 second electrical contact element
22 electrical contact element
30 electric device
31 optical element
100 carrier substrate
110 first main surface
115 first main surface of the device
120 second main surface
130 back side metallization
140 first semiconductor layer
142 active zone
145 roughened surface of the first semiconductor layer
150 second semiconductor layer
160 second current spreading layer
165 contact layer
170 insulating layer
180 first current spreading layer
190 bonding layer
195 passivation layer
196 protective layer
200 electrically conductive material
201 electrically conductive material of the first electrical contact element
202 insulating layer
205 reflecting conductive layer
207 first contact opening
208 second contact opening
210 first contact portion
211 second contact portion
220 first electrically conductive carrier member
222 second electrically conductive carrier member
225 carrier

The invention claimed is:

1. A method for manufacturing an optoelectronic device comprising:
  forming an optoelectronic semiconductor chip configured to emit electromagnetic radiation, wherein the optoelectronic semiconductor chip comprises:
  a first semiconductor layer having a first conductivity type;
  a second semiconductor layer having a second conductivity type;
  a first current spreading layer and a second current spreading layer; and
  a plurality of electrical contact elements, wherein the first semiconductor layer is arranged over the second semiconductor layer;
  wherein electromagnetic radiation emitted by the optoelectronic semiconductor chip is output via a first main surface of the first semiconductor layer;
  wherein the first current spreading layer is arranged on a side of the second semiconductor layer facing away from the first semiconductor layer;
  wherein the plurality of electrical contact elements is configured to electrically connect the first semiconductor layer to the current spreading layer;
  wherein the plurality of electrical contact elements comprises a first electrical contact element and a second electrical contact element, wherein the second current spreading layer is electrically connected to the second semiconductor layer; and
  forming an insulating layer between the first electrical contact element and the second current spreading layer and between the second electrical contact element and the second current spreading layer, wherein a first insulating layer is formed adjacent to the first contact element and comprises a first laterally measured layer thickness and a second insulating layer is formed adjacent to the second contact element and comprises a second laterally measured layer thickness, and wherein the first laterally measured layer thickness is different from the second laterally measured layer thickness so that a distance between the first contact element to the second current spreading layer is different from the distance between the second contact element to the second current spreading layer.

2. The method according to claim 1, wherein the forming the optoelectronic semiconductor chip comprises:
  forming the first semiconductor layer of the first conductivity type on a growth substrate;
  forming the second semiconductor layer of the second conductivity type across the first semiconductor layer;
  forming the second current spreading layer across the second semiconductor layer;
  forming a plurality of electrical contact elements; and
  forming the first current spreading layer across the second current spreading layer to form a layer stack; and
  wherein the method further comprises:
  subsequently placing the layer stack on a carrier; and
  subsequently removing the growth substrate.

3. An electric device comprising an optoelectronic device comprising an optoelectronic semiconductor chip configured to emit electromagnetic radiation, wherein the optoelectronic semiconductor chip comprises:
  a first semiconductor layer having a first conductivity type;
  a second semiconductor layer having a second conductivity type;
  a first current spreading layer and a second current spreading layer; and
  a plurality of electrical contact elements, wherein the first semiconductor layer is arranged over the second semiconductor layer,
  wherein electromagnetic radiation emitted by the optoelectronic semiconductor chip is output via a first main surface of the first semiconductor layer,
  wherein the first current spreading layer is arranged on a side of the second semiconductor layer facing away from the first semiconductor layer,
  wherein the plurality of electrical contact elements is configured to electrically connect the first semiconductor layer to the current spreading layer,
  wherein the plurality of electrical contact elements comprises a first electrical contact element and a second electrical contact element,
  wherein the second current spreading layer is electrically connected to the second semiconductor layer,
  wherein the electrical contact elements comprise a first electrical contact element and a second electrical contact element,
  wherein the first electrical contact element is different from the second electrical contact element, wherein the second current spreading layer is arranged between the first current spreading layer and the second semiconductor layer, wherein an insulating layer insulates the first electrical contact element and the second electrical contact element from the second current spreading layer, wherein a first insulating layer is adjacent to the first contact element and comprises a first laterally measured layer thickness and a second insulating layer is adjacent to the second contact element and comprises a second laterally measured layer thickness, wherein the first laterally measured layer thickness is different from the second laterally measured layer thickness so that a distance between the first contact element to the second current spreading layer is different from the distance between the second contact element to the second current spreading layer.

4. The electric device according to claim 3, wherein the electric device is selected from the group comprising vehicle headlights, projectors, illumination devices, and combinations thereof.

5. An optoelectronic device comprising:
an optoelectronic semiconductor chip configured to emit electromagnetic radiation; wherein the optoelectronic semiconductor chip comprises:
a first semiconductor layer having a first conductivity type;
a second semiconductor layer having a second conductivity type;
a first current spreading layer and a second current spreading layer; and
a plurality of electrical contact elements;
wherein the first semiconductor layer is arranged over the second semiconductor layer;
wherein electromagnetic radiation emitted by the optoelectronic semiconductor chip is output via a first main surface of the first semiconductor layer;
wherein the first current spreading layer is arranged on a side of the second semiconductor layer facing away from the first semiconductor layer;
wherein the plurality of electrical contact elements is configured to electrically connect the first semiconductor layer to the first current spreading layer;
wherein the second current spreading layer is electrically connected to the second semiconductor layer; and
wherein the electrical contact elements comprise a first electrical contact element and a second electrical contact element; wherein the first electrical contact element is different from the second electrical contact element;
wherein the second current spreading layer is arranged between the first current spreading layer and the second semiconductor layer, wherein an insulating layer insulates the first electrical contact element and the second electrical contact element from the second current spreading layer; and
wherein a first insulating layer is adjacent to the first contact element and comprises a first laterally measured layer thickness and a second insulating layer is adjacent to the second contact element and comprises a second laterally measured layer thickness, and wherein the first laterally measured layer thickness is different from the second laterally measured layer thickness so that a distance between the first contact element to the second current spreading layer is different from the distance between the second contact element to the second current spreading layer.

6. The optoelectronic device according to claim 4, wherein the optoelectronic semiconductor chip comprises a plurality of active zones arranged in an area between the first semiconductor layer and the second semiconductor layer and between the electrical contact elements, respectively;
wherein the first electrical contact element is connected to an associated active zone via a first resistance value, wherein the second electrical contact element is connected to an associated active zone via a second resistance value; and
the first resistance value differs from the second resistance value.

7. The optoelectronic device according to claim 5, wherein the electrical contact elements extend through the second semiconductor layer, and wherein the electrical contact elements are insulated from the material of the second semiconductor layer via an insulating layer.

8. The optoelectronic device according to claim 5, wherein a diameter of the first contact element differs from the diameter of the second contact element.

9. The optoelectronic device according to claim 5, further comprising a contact layer configured to electrically connect the second current spreading layer to the second semiconductor layer.

10. The optoelectronic device according to claim 9, wherein a lateral distance of the contact layer from the first contact element differs from the lateral distance of the contact layer from the second contact element.

11. The optoelectronic device according to claim 6, wherein the first current spreading layer is connected to a first contact portion arranged on a first main surface of the optoelectronic device, wherein the first contact element is arranged closer to the first contact portion than the second contact element, and wherein the first resistance value is greater than the second resistance value.

12. The optoelectronic device according to claim 11, wherein the sum S1 of lead resistances through the first current spreading layer and the second current spreading layer and series resistances through the first semiconductor layer and the second semiconductor layer for the first electrical contact element and the sum S2 of lead resistances through the first current spreading layer and the second current spreading layer and series resistances through the first semiconductor layer and the second semiconductor layers for the second electrical contact element satisfy the following relationship: $|S1-S2|/S1<0.3$.

13. The optoelectronic device according to claim 5, wherein the first current spreading layer is connected to a first contact portion, wherein the second current spreading layer is connected to a second contact portion, and wherein the first contact portion and the second contact portion are each arranged on a first main surface of the optoelectronic device.

14. The optoelectronic device according to claim 5, wherein the optoelectronic semiconductor chip is arranged on a heat-dissipating carrier comprising areas of different thermal conductivity.

15. The optoelectronic device according to claim 14, wherein the second contact element is arranged in an area with a better thermal conductivity than the area in which the first contact element is arranged.

16. The optoelectronic device according to claim 14, wherein the heat-dissipating carrier connects the first current spreading layer to a first contact portion and connects the second current spreading layer to a second contact portion.

\* \* \* \* \*